US011632630B2

(12) United States Patent

Lee et al.

(10) Patent No.: US 11,632,630 B2
(45) Date of Patent: Apr. 18, 2023

(54) SPEAKER ASSEMBLY AND DISPLAY DEVICE COMPRISING IT

(71) Applicant: LG ELECTRONICS INC., Seoul (KR)

(72) Inventors: Sangkeun Lee, Seoul (KR); Hyunseung Youn, Seoul (KR); Yongjun Je, Seoul (KR); Genmoo Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/155,809

(22) Filed: Jan. 22, 2021

(65) Prior Publication Data

US 2022/0038822 A1 Feb. 3, 2022

(30) Foreign Application Priority Data

Jul. 28, 2020 (KR) ........................ 10-2020-0093827

(51) Int. Cl.
*H04R 9/06* (2006.01)
*H04R 1/02* (2006.01)
(Continued)

(52) U.S. Cl.
CPC ............... *H04R 9/06* (2013.01); *H04R 1/028* (2013.01); *H04R 7/04* (2013.01); *H04R 7/18* (2013.01);
(Continued)

(58) Field of Classification Search
CPC .. H04R 25/407; H04R 25/405; H04R 25/402; H04R 25/552; H04R 3/005; H04R 3/12;
(Continued)

(56) References Cited

U.S. PATENT DOCUMENTS 9,271,085 B2 * 2/2016 Kim ........................ H04R 9/043
9,621,992 B2 * 4/2017 Wang ........................ H04R 9/06
(Continued)

FOREIGN PATENT DOCUMENTS

EP 1950998 7/2008
JP 09-009391 1/1997
(Continued)

OTHER PUBLICATIONS

European Patent Office Application Serial No. 21153188.4, Search Report dated Jul. 2, 2021, 8 pages.
(Continued)

*Primary Examiner* — Ahmad F. Matar
*Assistant Examiner* — Sabrina Diaz
(74) *Attorney, Agent, or Firm* — Lee Hong Degerman Kang & Waimey

(57) ABSTRACT

A speaker assembly, and a display device including the same are provided. The speaker assembly according to an aspect of the present disclosure includes: a pair of magnets facing each other; a bobbin disposed between the pair of magnets and formed in a shape of a plate that extends long; a coil formed on at least one surface of the bobbin; a diaphragm fixed to one side of the bobbin, and extending in a direction intersecting a longitudinal direction of the bobbin; a frame disposed between the pair of magnets and the diaphragm; and a speaker edge disposed between the frame and the diaphragm, having one end fixed to the frame and the other end fixed to the diaphragm, and being convexly curved toward the bobbin.

9 Claims, 9 Drawing Sheets

(51) Int. Cl.

| | |
|---|---|
| ***H04R 7/04*** | (2006.01) |
| ***H04R 7/18*** | (2006.01) |
| ***H04R 9/02*** | (2006.01) |
| ***H04R 9/04*** | (2006.01) |
| *H01L 51/52* | (2006.01) |

(52) U.S. Cl.
CPC ............. *H04R 9/025* (2013.01); *H04R 9/043* (2013.01); *H01L 51/5237* (2013.01); *H04R 2400/11* (2013.01); *H04R 2499/15* (2013.01)

(58) Field of Classification Search
CPC . H04R 5/02; H04R 5/023; H04R 7/04; H04R 2499/11; H04R 2499/15; H04R 2201/023; H04R 2205/021; H04R 9/046; H04R 9/06; H04R 9/045; H04R 9/04; H04R 9/063; H04R 9/025; H04R 9/043; H04R 7/18; H04R 2400/11; H04R 1/025; H04R 1/02; H04R 1/028; H04R 1/26; H04R 1/323; H04R 1/345; H04R 1/403; H04R 1/2888; B60R 11/0217; B60R 2011/0019; B60R 2011/0059; H01L 51/5237
USPC ........ 381/333, 334, 336, 388, 392, 405, 407
See application file for complete search history.

(56) References Cited

U.S. PATENT DOCUMENTS

| | | | | |
|---|---|---|---|---|
| 9,942,663 | B1 * | 4/2018 | Salvatti .................. | H04R 9/025 |
| 10,469,954 | B1 | 11/2019 | Cheng et al. | |
| 2002/0118847 | A1 * | 8/2002 | Kam ...................... | H04R 7/045<br>381/152 |
| 2003/0103642 | A1 | 6/2003 | Kam | |
| 2008/0205686 | A1 * | 8/2008 | Tagami .................. | H04R 9/025<br>381/398 |
| 2009/0257617 | A1 * | 10/2009 | Ikeda ..................... | H04R 31/00<br>29/829 |
| 2018/0146294 | A1 | 5/2018 | Zhu et al. | |

FOREIGN PATENT DOCUMENTS

| | | |
|---|---|---|
| JP | 2002176693 | 6/2002 |
| JP | 2002223495 | 8/2002 |
| KR | 1020060106472 | 10/2006 |
| KR | 101259399 | 4/2013 |

OTHER PUBLICATIONS

Korean Intellectual Property Office Application No. 10-2020-0093827, Notice of Allowance dated Apr. 9, 2021, 5 pages.

* cited by examiner

SPEAKER ASSEMBLY AND DISPLAY DEVICE COMPRISING IT

CROSS-REFERENCE TO RELATED APPLICATION

Pursuant to 35 U.S.C. § 119(a), this application claims the benefit of earlier filing date and right of priority to Korean Patent Application No. 10-2020-0093827, filed on Jul. 28, 2020, the contents of which are hereby incorporated by reference herein in its entirety.

BACKGROUND OF THE INVENTION

1. Field of the Invention

The present disclosure relates to a speaker assembly, and a display device including the same.

2. Description of the Related Art

With the development of information society, there are increasing demands for various types of display devices. In order to meet such demands, various display devices have been developed and used, including a Liquid Crystal Display (LCD), a Plasma Display Panel (PDP), an Electro luminescent Display (ELD), a Vacuum Fluorescent Display (VFD), an Organic Light Emitting Diode (OLED), and the like.

Among these devices, the OLED display devices have effects in that in comparison with the LCD devices, the OLED display devices are excellent in brightness and viewing angle characteristics and require no backlight unit, such that the OLED display devices can be realized as ultra-thin displays.

Recently, many studies have been conducted on a speaker assembly which is suitable for use in the structure of the display devices and provides high sound quality.

SUMMARY OF THE INVENTION

It is an object of the present disclosure to solve the above and other problems.

It is another object of the present disclosure to provide a speaker assembly capable of providing high sound quality.

It is yet another object of the present disclosure to provide a speaker assembly having a slim structure while maintaining a high sound pressure level.

It is still another object of the present disclosure to provide a speaker assembly capable of increasing the amplitude of the speaker.

In accordance with an aspect of the present disclosure, the above and other objects can be accomplished by providing a speaker assembly and a display device including the same, the speaker assembly including: a pair of magnets facing each other; a bobbin disposed between the pair of magnets and formed in a shape of a plate that extends long; a coil formed on at least one surface of the bobbin; a diaphragm fixed to one side of the bobbin, and extending in a direction intersecting a longitudinal direction of the bobbin; a frame disposed between the pair of magnets and the diaphragm; and a speaker edge disposed between the frame and the diaphragm, having one end fixed to the frame and the other end fixed to the diaphragm, and being convexly curved toward the bobbin.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
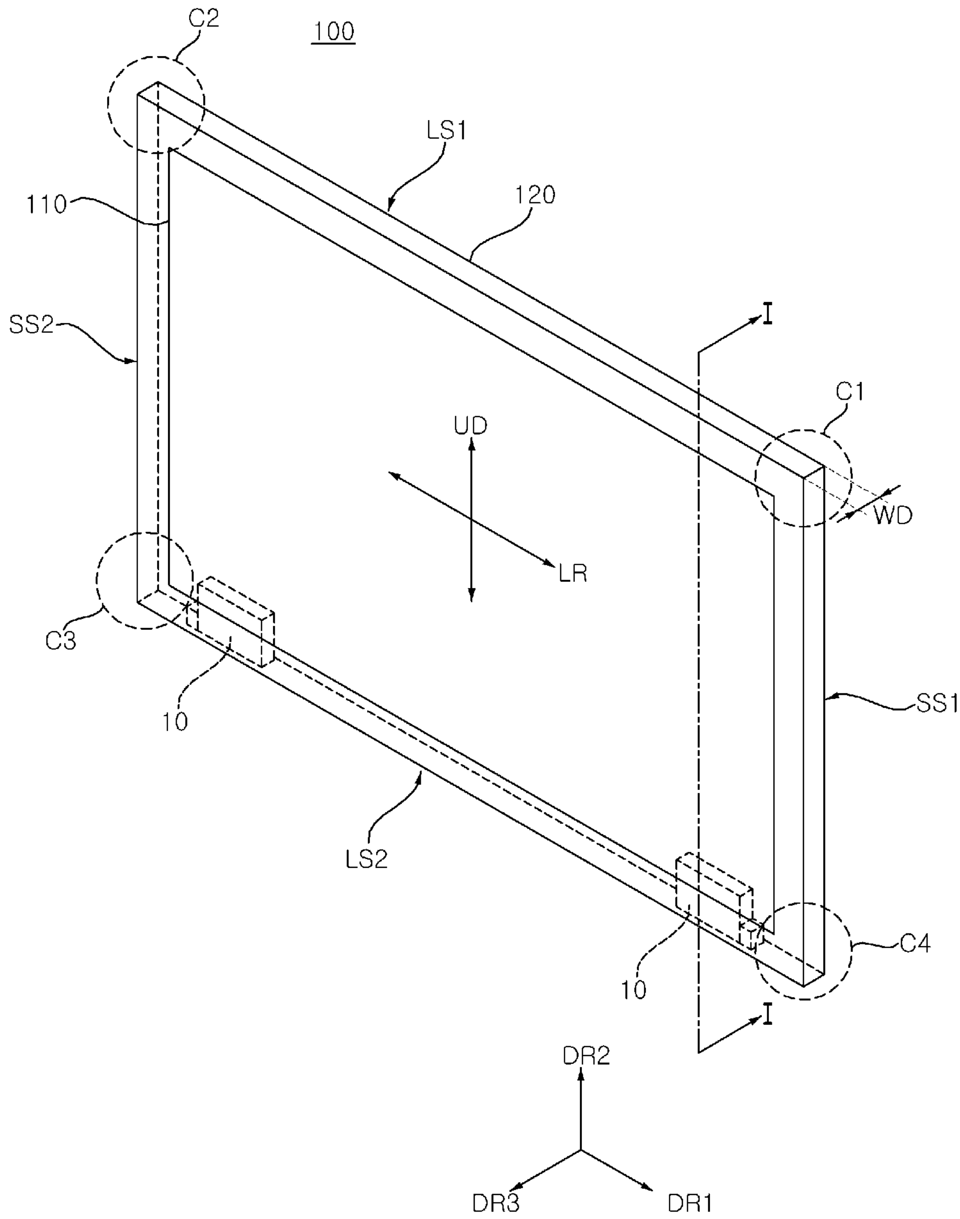
FIGS. 1 to 9 are diagrams illustrating examples of a speaker assembly, and a display device including the same, according to embodiments of the present disclosure.

Hereinafter, the present disclosure will be described in detail with reference to the accompanying drawings. In order to clearly and briefly describe the present disclosure, components that are irrelevant to the description will be omitted in the drawings. The same reference numerals are used throughout the drawings to designate the same or similar components, and a redundant description thereof will be omitted.

Terms "module" and "part" for elements used in the following description are given simply in view of the ease of the description, and do not carry any important meaning or role. Therefore, the "module" and the "part" may be used interchangeably. Descriptions of some well-known technologies that possibly obscure the disclosure will be omitted, if necessary. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

It should be understood that the terms "comprise", "include", "have", etc. when used in this specification, specify the presence of stated features, integers, steps, operations, elements, components, or combinations of them but do not preclude the presence or addition of one or more other features, integers, steps, operations, elements, components, or combinations thereof.

The following description of a display panel will be given by using an Organic Light Emitting Diode (OLED) as an example, but the display panel which may be applied to the present disclosure is not limited to the OLED panel.

Referring to FIG. 1, a display device 100 may include a first long side LS1; a second long side LS2 facing the first long side LS1; a first short side SS1 adjacent to the first long side LS1 and the second long side LS2; and a second short side SS2 facing the first short side SS1.

In the display device 100, an area of the first short side SS1 may be referred to as a first side area, and an area of the second short side SS2 may be referred to as a second side area facing the first side area. In the display device 100, an area of the first long side LS1 may be referred to as a third side area being adjacent to the first side area and the second side area, and being disposed between the first side area and the second side area; and an area of the second long side LS2 may be referred to as a fourth side area being adjacent to the first side area and the second side area, being disposed between the first side area and the second side area, and facing the third side area.

For convenience of explanation, FIG. 1 illustrates an example in which the length of the first and second long sides LS1 and LS2 is greater than the length of the first and second short sides SS1 and SS2, but the length of the first and second long sides LS1 and LS2 may be approximately equal to the length of the first and second short sides SS1 and SS2.

In the following description, a first direction DR1 is a direction parallel to the first and second long sides LS1 and LS2 of a display panel 110, and a second direction DR2 is a direction parallel to the first and second short sides SS1 and SS2 of the display panel 110. A third direction DR3 may be a direction perpendicular to the first direction DR1 and/or the second direction DR2.

A side or a surface, on which the display device 100 displays an image, may be referred to as a front side or a front surface. When the display device 100 displays the image, a side or a surface, at which the image may not be viewed, may be referred to as a back side or a back surface. When the display device 100 is viewed from the front side or the front surface, the first long side LS1 may be referred to as an upper side or an upper surface, and the second long side LS2 may be referred to as a lower side or a lower surface. When the display device 100 is viewed from the front side or the front surface, the first short side SS1 may be referred to as a right side or a right surface, and the second short side SS2 may be referred to as a left side or a left surface.

The first long side LS1, the second long side LS2, the first short side SS1, and the second short side SS2 may be referred to as edges of the display device 100. Further, positions where the first long side LS1, the second long side LS2, the first short side SS1, and the second short side SS2 meet each other may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

A direction from the first short side SS1 to the second short side SS2 or a direction from the second short side SS2 to the first short side SS1 may be referred to as a left-right direction LR or a horizontal direction DR1. A direction from the first long side LS1 to the second long side LS2 or a direction from the second long side LS2 to the first long side LS1 may be referred to as an up-down direction UD or a vertical direction DR2.

Further, a direction from the front surface to the back surface or a direction from the back surface to the front surface may be referred to as a front-rear direction DR3 or a thickness direction. The front-rear direction DR3 may be a direction perpendicular to the left-right direction DR1 and/or the vertical direction DR2.

The display device 100 may include the display panel 110, a main frame 120, and a speaker assembly 10.

The display pane 110 may be provided on the front surface of the display device 100 and may display images.

The main frame 120 may be disposed at a rear portion of the display panel 110. The main frame 120 may be connected to the display panel 110.

The speaker assembly 10 may be disposed adjacent to a lower end of the main frame 120 to be installed at the main frame 120. The speaker assembly 10 may direct sound downwardly of the display device 100.

Figure 2:
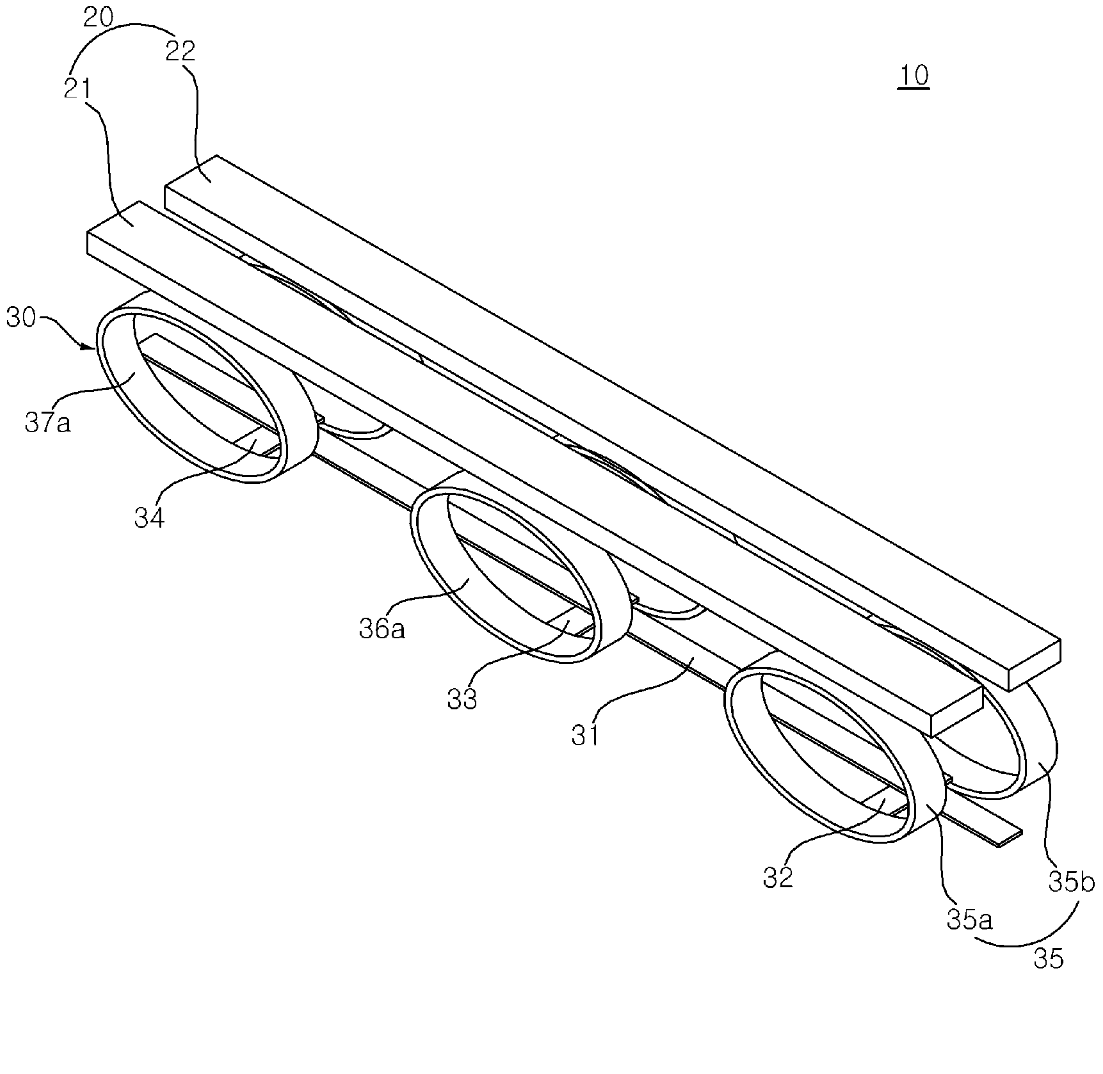
Figure 3:
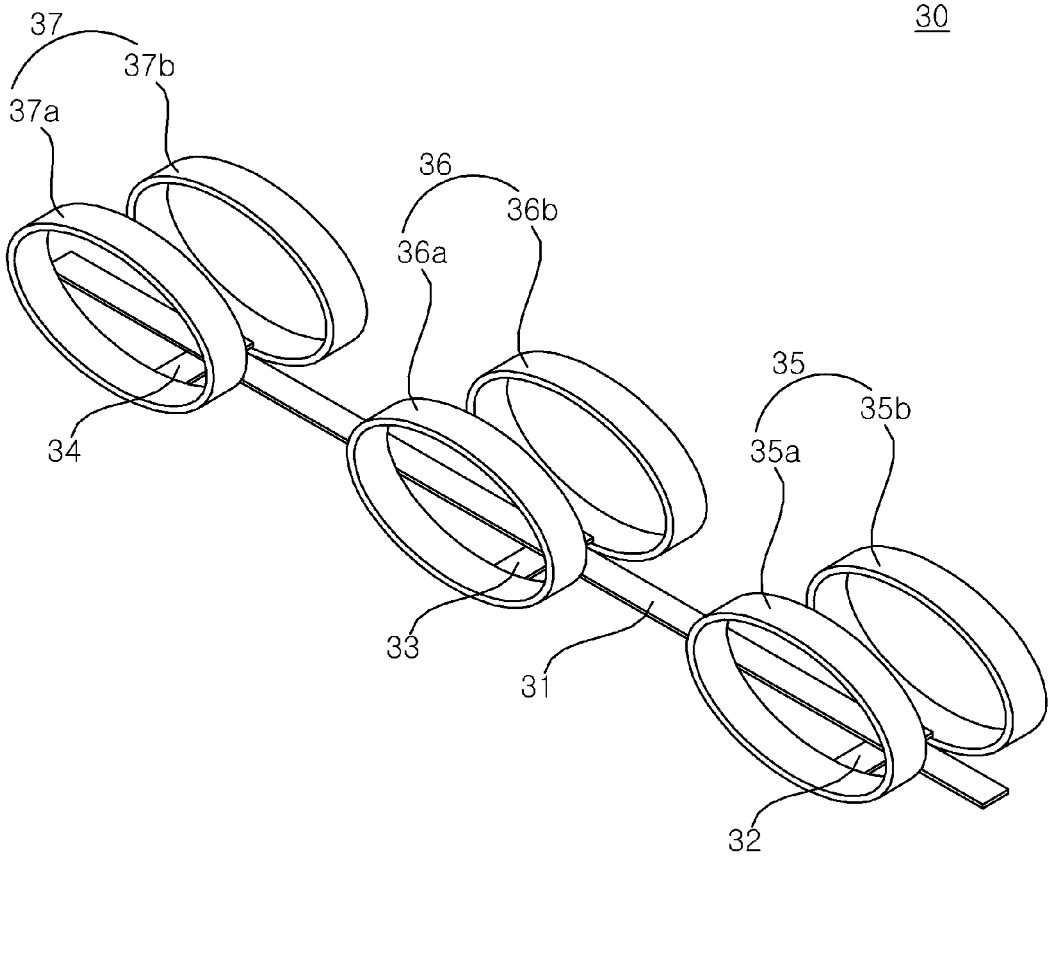

Referring to FIGS. 2 and 3, the plate 20 may be formed in the shape of a flat plate that extends long. For example, the plate 20 may be metal. In another example, the plate 20 may be a synthetic resin. The plate 20 may include a first plate 21 and a second plate 22. The first plate 21 may be parallel to the second plate 22 and may be spaced apart from the second plate 22. The plate 20 may be referred to as a rear plate 20.

An elastic member 30 may support the plate 20. The elastic member 30 may be connected or fixed to a lower part of the plate 20. The elastic member 30 may be referred to as a damper 30. The elastic member 30 may include a center plate 31, bridges 32, 33, and 34, and circles 35, 36, and 37. For example, the elastic member 30 may be metal. In another example, the elastic member 30 may be a synthetic resin.

The center plate 31 may extend long in a longitudinal direction of the plate 20 and may be disposed between the first plate 21 and the second plate 22. The center plate 31 may be spaced apart from the first plate 21 and the second plate 22 at a position below the first plate 21 and the second plate 22.

The bridges 32, 33, and 34 may be disposed in a direction intersecting a longitudinal direction of the center plate 31, and may extend across the center plate 31.

The circles 35, 36, and 37 facing each other may be connected or fixed to both ends of the bridges 32, 33, and 34. For example, the circles 35, 36, and 37 may have an elliptical shape. The circles 35, 36, and 37 may have elasticity. Upper surfaces of the circles 35, 36, and 37 may come into contact with the plate 20.

The first bridge 32 may be disposed adjacent to one end of the center plate 31. A first circle 35*a* may be disposed on one end of the first bridge 32, and a second circle 35*b* may be disposed on the other end of the first bridge 32. The third bridge 34 may be disposed adjacent to the other end of the center plate 31. A fifth circle 37*a* may be disposed on one end of the third bridge 34, and a sixth circle 37*b* may be disposed on the other end of the third bridge 34. The second bridge 33 may be disposed between the first bridge 32 and the third bridge 34. The third circle 36*a* may be disposed on one end of the second bridge 36*b*, and the fourth circle 36*b* may be disposed on the other end of the second bridge 33. The circles 35, 36, and 37 may be connected or fixed to the bridges 32, 33, and 34.

The first circle 35*a* may face the second circle 35*b* with respect to the center plate 31, the third circle 36*a* may face the fourth circle 36*b* with respect to the center plate 31, and the fifth circle 37*a* may face the sixth circle 37*b* with respect to the center plate 31.

Accordingly, a range of motion of the damper 30 may be increased or maximized relative to the size of the speaker assembly 10. The range of motion of the damper 30 may correlate to a reproduction band of the speaker assembly 10, such that a sound reproduction band of the speaker assembly 10 may be improved. In addition, sound pressure of the speaker assembly 10 may also be improved.

Figure 4:
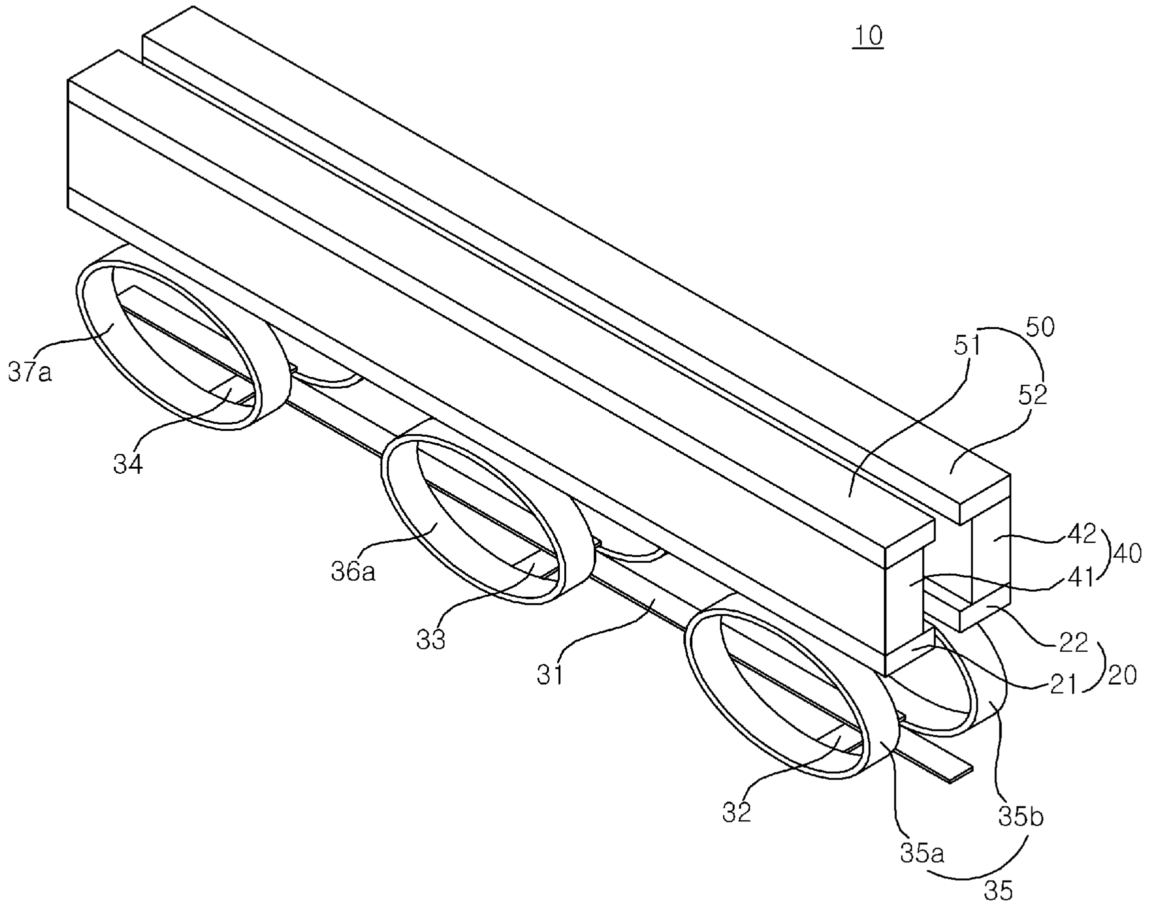
Figure 5:
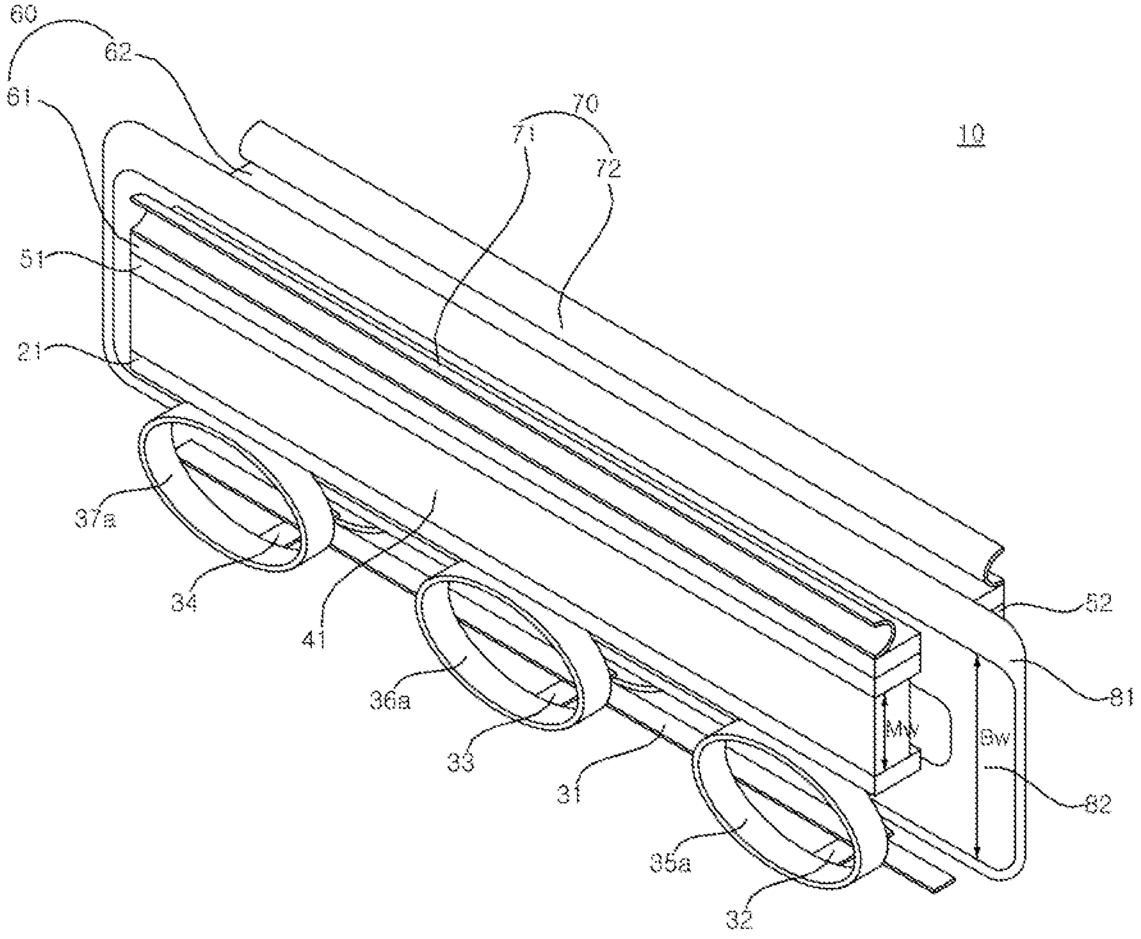

Referring to FIGS. 4 and 5, magnets 40 may be disposed on the rear plate 20. The magnets 40 may have a square column shape that extends long. A first magnet 41 may be connected or fixed to an upper portion of the first rear plate 21, and a second magnet 42 may be connected or fixed to an upper portion of the second rear plate 22. The first magnet 41 may face the second magnet 42 with respect to the center plate 31.

A plate 50 may extend long. The plate 50 may be connected or fixed to an upper portion of the magnets 40. The plate 50 may be referred to as a front plate 50. A first front plate 51 may be disposed on the first magnet 41, and the second front plate 52 may be disposed on the second magnet 42. The first front plate 51 may face the first rear plate 21 with respect to the first magnet 41. The second front plate 52 may face the second rear plate 22 with respect to the second magnet 42.

A bobbin 81 may be formed in the shape of a flat plate that extends long. For example, the bobbin 81 may be a printed circuit board (PCB). A voice coil 82 may be wound around the bobbin 81. The voice coil 82 may be wound around the bobbin 81 to form a closed-loop. For example, the voice coil 82 may be printed on the bobbin 81. A vertical width Bw of the voice coil 82 may be greater than a vertical width Mw of the magnets 40. The bobbin 81 may be disposed between the first magnet 41 and the second magnet 42. When a current flows through the voice coil 82, the bobbin 81 may move in a vertical direction. A lower end of the bobbin 81 may be connected or fixed to the center plate 31.

Figure 6:
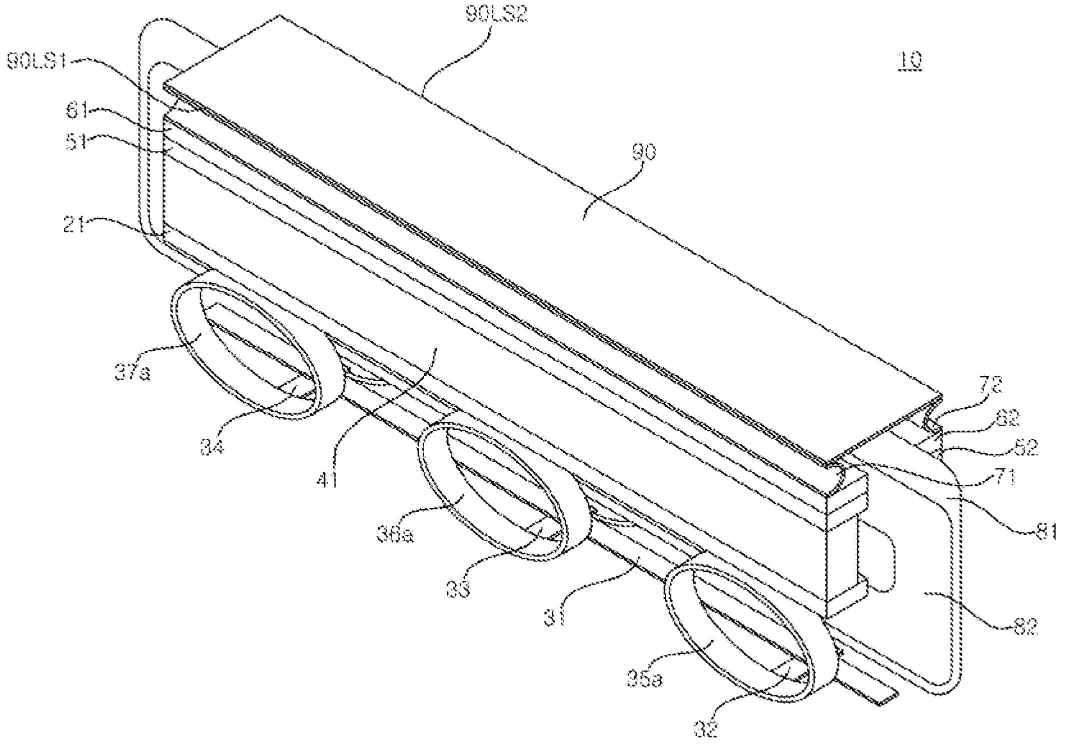

Referring to FIGS. 5 and 6, a frame 60 may be formed in the shape of a flat plate that extends long. The frame 60 may be connected or fixed to an upper portion of the front plate 50. A first frame 61 may be disposed on the first front plate 51, and a second frame 62 may be disposed on the second front plate 52.

A speaker edge 70 may be connected or fixed to an upper portion of the frame 60. The speaker edge 70 may have elasticity. The speaker edge 70 may be formed in the shape of a cylinder that extends long. The speaker edge 70 may be formed in the shape of a cylinder cut in half. For example, the speaker edge 70 may have a U-shaped cross-section. A first speaker edge 71 may be connected or fixed to an upper portion of the first frame 61, and a second speaker edge 72 may be connected or fixed to an upper portion of the second frame 62. The first speaker edge 71 may be convex toward the second speaker edge 72, and the second speaker edge 72 may be convex toward the first speaker edge 71.

A diaphragm 90 may be formed in the shape of a plate that extends long. The diaphragm 90 may be fixed to an upper end of the bobbin 81. One long side 90LS1 of the diaphragm 90 may be connected or fixed to the first speaker edge 71, and the other long side 90LS2 of the diaphragm 90 may be connected or fixed to the second speaker edge 72. Accordingly, an area of the diaphragm 90 may be maximized relative to a thickness of the speaker assembly 10, and sound pressure may be improved.

Figure 7:
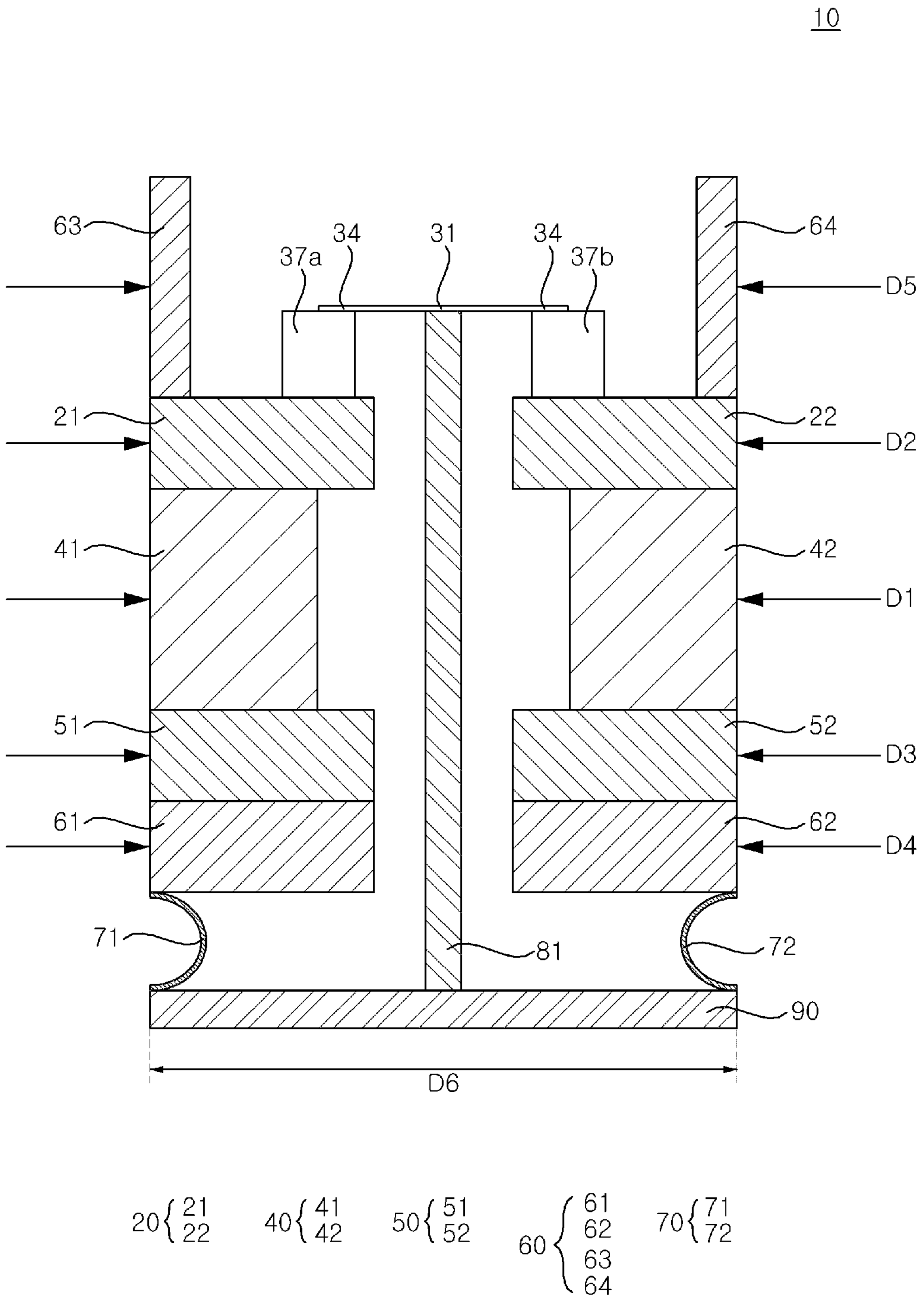

Referring to FIG. 7, an outer surface of the first magnet 41 and an outer surface of the second magnet 42 may be exposed to the outside of the speaker assembly 10. For example, a first distance D1 from the outer surface of the first magnet 41 to the outer surface of the second magnet 42 may be the thickness of the speaker assembly 10. Outer surfaces of the plates 20 and 60 may be aligned with respect to the outer surfaces of the magnets 40. The outer surfaces of the frames 60 may be aligned with respect to the outer surfaces of the magnets 40.

A second distance D2 between an outer surface of the first rear plate 211 and an outer surface of the second rear plate 22 may be substantially equal to the first distance D1. A third distance D3 between an outer surface of the first front plate 51 and an outer surface of the second front plate 52 may be substantially equal to the first distance D1.

A fourth distance D4 between an outer surface of the first front frame 61 and an outer surface of the second front frame 62 may be substantially equal to the first distance D1. A fifth distance D5 between an outer surface of the first rear frame 63 and an outer surface of the second rear frame 64 may be substantially equal to the first distance D1.

A sixth distance D6 between one long side of the diaphragm 90 and the other long side of the diaphragm 90 may be substantially equal to the first distance D1. The sixth distance D6 may be substantially equal to the thickness of the speaker assembly 10. Accordingly, sound pressure generated by the diaphragm 90 may be maximized.

Figure 8:
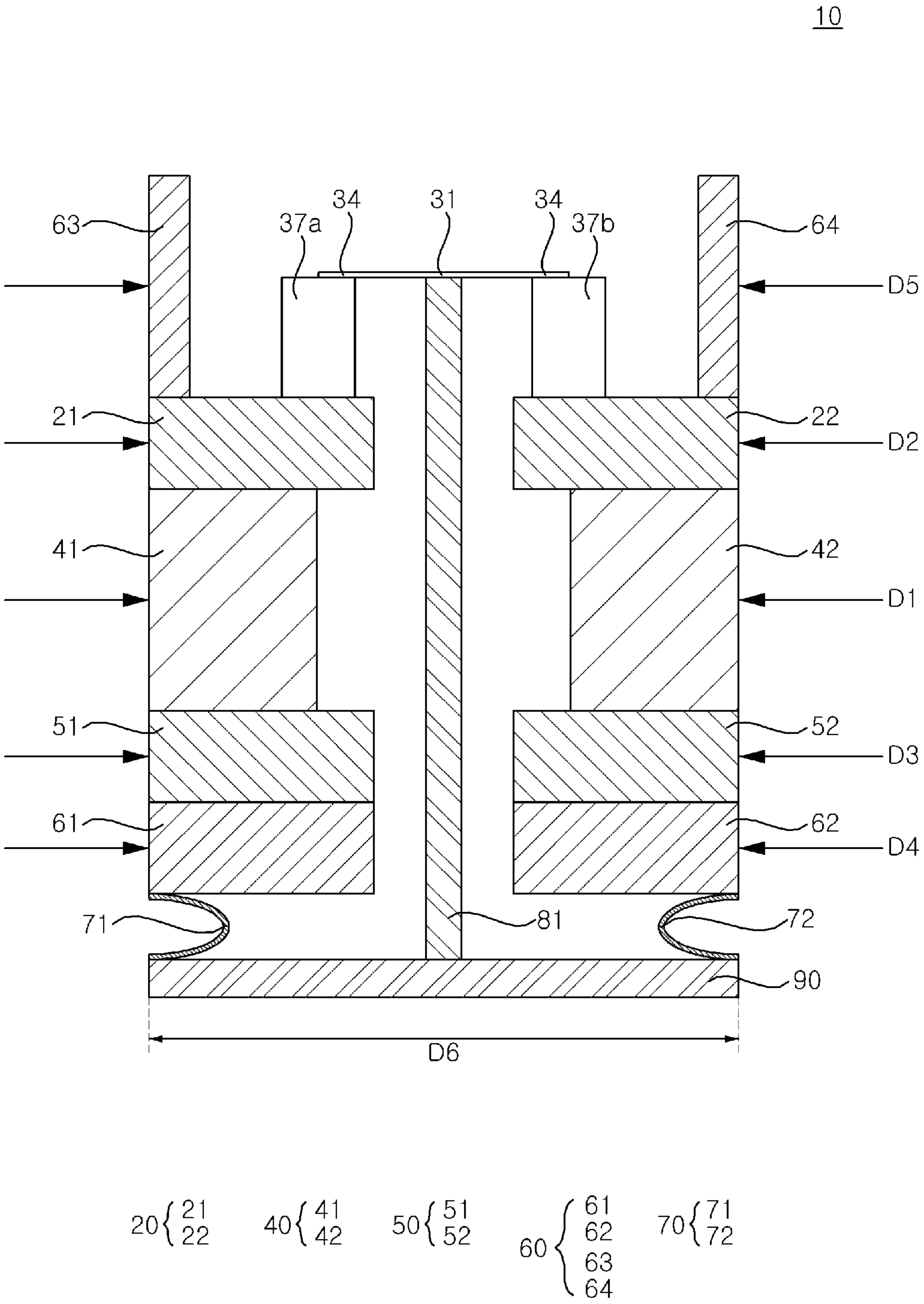

Referring to FIG. 8, the bobbin 81 may move from the front frames 61 and 62 toward the rear frames 63 and 64. As the bobbin 81 moves, the diaphragm 90 may move closer to the front frames 61 and 62, and the speaker edge 70 may be compressed. At the same time, the circles 37*a* and 37*b* of the damper 30 may be stretched in a longitudinal direction of the bobbin 81, such that a range of motion of the circles 37*a* and 37*b* of the damper 30 may be increased, and thus the amplitude of the diaphragm 90 may be increased.

Figure 9:
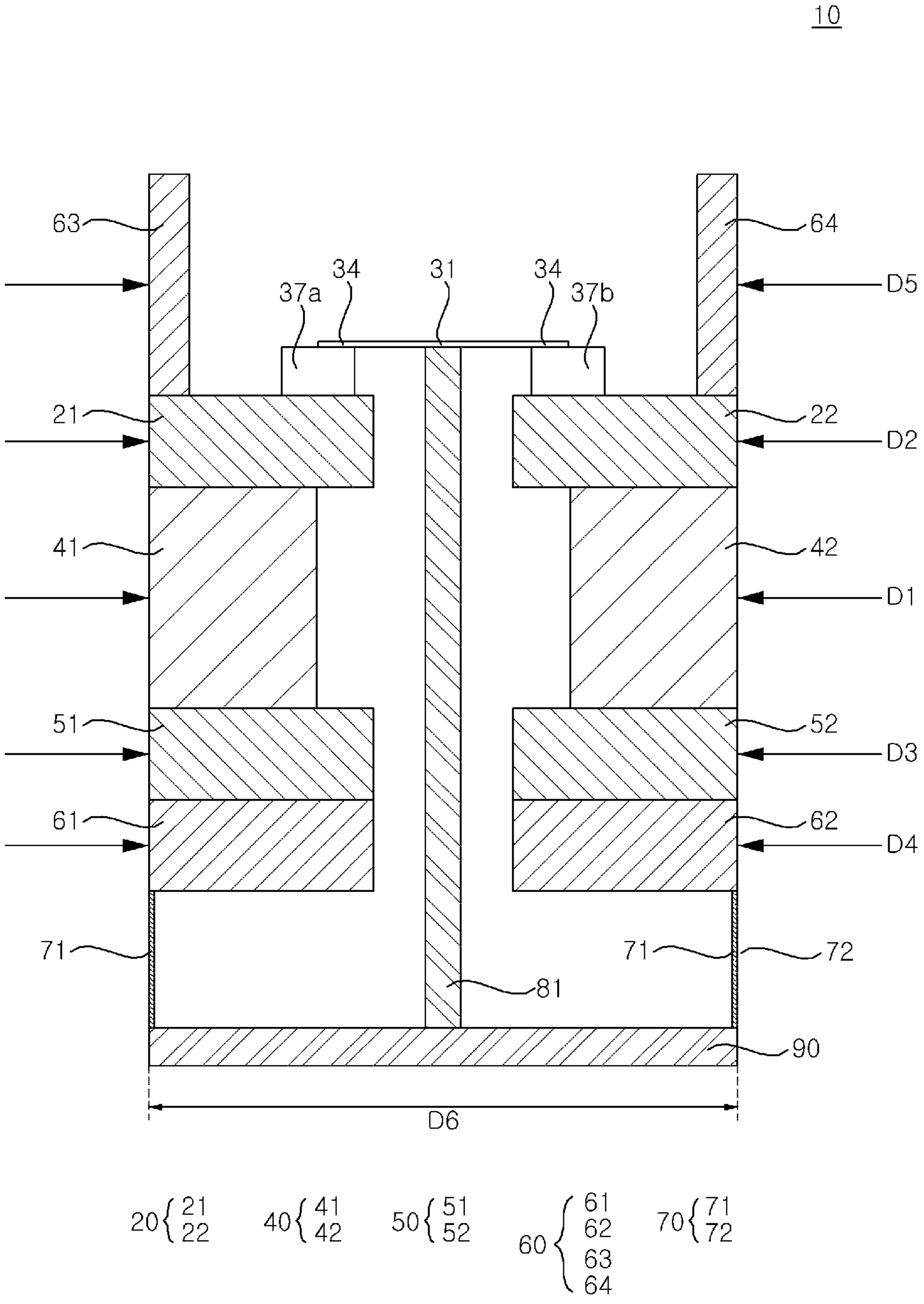

Referring to FIG. 9, the bobbin 81 may move from the rear frames 63 and 64 toward the front frames 61 and 62. As the bobbin 81 moves, the diaphragm 90 may move further away from the front frames 61 and 62, and the speaker edge 70 may be stretched. At the same time, the circles 37*a* and 37*b* of the damper 30 may be compressed in a longitudinal direction of the bobbin 81, such that a range of motion of the circles 37*a* and 37*b* of the damper 30 may be increased, and thus the amplitude of the diaphragm 90 may be increased.

Referring to FIGS. 1 to 9, the speaker assembly includes: a pair of magnets 40 facing each other; a bobbin 81 disposed between the pair of magnets 40 and formed in a shape of a plate that extends long; a coil 82 formed on at least one surface of the bobbin; a diaphragm 90 fixed to one side of the bobbin 81, and extending in a direction intersecting a longitudinal direction of the bobbin 81; a frame 60 disposed between the pair of magnets 40 and the diaphragm 90; and a speaker edge 70 disposed between the frame 60 and the diaphragm 90, having one end fixed to the frame 60 and the other end fixed to the diaphragm 90, and being convexly curved toward the bobbin 81.

The speaker assembly may further include a damper 30 disposed to face the frame 60 with respect to the pair of magnets 40, fixed to the other side of the bobbin 81 which faces the one side of the bobbin 81, and providing elasticity to the bobbin 81.

The damper may include: a center plate 31 extending long along the other side of the bobbin 81, and fixed to the other side of the bobbin 81; bridges 32, 33, and 34 disposed across the center plate 31 and fixed to the center plate 31; and a plurality of circles 35, 36, and 37 fixed to both ends of the bridges 32, 33, and 34 and disposed to face each other with respect to the center plate 31.

The speaker assembly may further include a rear plate 20 disposed between the pair of magnets 40 and the plurality of circles 35, 36, and 37, and fixed to the pair of magnets 40 and the plurality of circles 35, 36, and 37.

The speaker edge 70 may include: a first speaker edge 71 having one end fixed to one side of the diaphragm 90 and the other end fixed to the frame 60, and being convexly curved toward the bobbin 81; and a second speaker edge 72 having one end fixed to the other side of the diaphragm 90, which faces the one side of the diaphragm 90, and the other end fixed to the frame 60, and being convexly curved toward the bobbin 81.

The first speaker edge 71 may be symmetrical to the second speaker edge 72 with respect to the bobbin 81.

The rear plate 20 may include: a first rear plate 21 disposed between one of the pair of magnets 40 and one of the plurality of circles 35, 36, and 37; and a second rear plate 22 disposed between the other one of the pair of magnets 40 and another one of the plurality of circles 35, 36, and 37, wherein the first rear plate 21 may include: a first surface connected to one of the pair of magnets 40; and a second surface connected to one of the plurality of circles 35, 36, and 37, wherein the first surface and the second surface may face each other.

The diaphragm 90 may include: a first long side connected to the first speaker edge 71; a second long side connected to the second speaker edge 72; a first short side connecting one end of the first long side and one end of the second long side; and a second short side connecting the other end of the first long side and the other end of the second long side, and facing the first short side.

The display device may include: a display panel 110; a frame 120 connected to the display panel 110; and the speaker assembly of claim 1, which is disposed at a position adjacent to a lower end of the frame 120.

The diaphragm 90 may have a length in a left-right direction of the display panel 110 and may have a width in a thickness direction of the display panel 110.

The speaker assembly, and the display device including the same according to the present disclosure have the following effects.

According to at least one embodiment of the present disclosure, there is provided a speaker assembly capable of providing high sound quality.

According to at least one embodiment of the present disclosure, there is provided a speaker assembly having a slim structure while maintaining a high sound pressure level.

According to at least one embodiment of the present disclosure, there is provided a speaker assembly capable of increasing the amplitude of the speaker.

The additional scope of applicability of the present disclosure will be apparent from the above detailed description. However, those skilled in the art will appreciate that various modifications and alterations are possible, without departing from the idea and scope of the present disclosure, and therefore it should be understood that the detailed description and specific embodiments, such as the preferred embodiments of the present disclosure, are provided only for illustration.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A speaker assembly, comprising:

a pair of magnets facing each other;

a bobbin disposed between the pair of magnets and formed in a shape of a plate that extends long;

a coil formed on at least one surface of the bobbin;

a diaphragm fixed to one side of the bobbin, and extending in a direction intersecting a longitudinal direction of the bobbin;

a frame disposed between the pair of magnets and the diaphragm;

a speaker edge having one end fixed to the frame and the other end fixed to the diaphragm; and a damper opposite to the frame with respect to the pair of magnets, fixed to the other side of the bobbin which is opposite to the one side of the bobbin, and providing elasticity to the bobbin, wherein the speaker edge is disposed between the frame and the diaphragm in the longitudinal direction of the bobbin and is convexly curved toward the bobbin, wherein the damper comprises:

a center plate fixed to the other side of the bobbin;

a bridge disposed across the center plate and fixed to the center plate; and a plurality of circles fixed to both ends of the bridge and disposed to opposite each other with respect to the center plate.

2. The speaker assembly of claim 1, wherein the center plate extends along the other side of the bobbin, wherein the bridge comprises a plurality of bridges disposed across the center plate; and to which the plurality of circles are fixed.

3. The speaker assembly of claim 2, further comprising a rear plate disposed between the pair of magnets and the plurality of circles, and fixed to the pair of magnets and the plurality of circles.

4. The speaker assembly of claim 3, wherein the speaker edge comprises:

a first speaker edge having one end fixed to the diaphragm adjacent to one end of the diaphragm and the other end fixed to the frame, and being convexly curved toward the bobbin; and a second speaker edge having one end fixed to the diaphragm adjacent to the other end of the diaphragm, which is opposite to the one end of the diaphragm, and the other end fixed to the frame, and being convexly curved toward the bobbin.

5. The speaker assembly of claim 4, wherein the first speaker edge is symmetrical to the second speaker edge with respect to the bobbin.

6. The speaker assembly of claim 5, wherein the rear plate comprises:

a first rear plate disposed between one of the pair of magnets and one of the plurality of circles; and a second rear plate disposed between the other one of the pair of magnets and another one of the plurality of circles, wherein the first rear plate comprises:

a first surface connected to one of the pair of magnets; and a second surface connected to one of the plurality of circles, wherein the first surface and the second surface are opposite to each other.

7. The speaker assembly of claim 6, wherein the diaphragm comprises:

a first long side connected to the first speaker edge;

a second long side connected to the second speaker edge;

a first short side connecting one end of the first long side and one end of the second long side; and a second short side connecting the other end of the first long side and the other end of the second long side, and which is opposite to the first short side.

8. A display device, comprising:

a display panel;

a frame connected to the display panel; and the speaker assembly of claim 1, which is disposed at a position adjacent to a lower end of the frame.

9. The display device of claim 8, wherein the diaphragm has a length in a left-right direction of the display panel and has a width in a thickness direction of the display panel.

* * * * *